United States Patent

Liu et al.

[11] Patent Number: 5,977,572
[45] Date of Patent: Nov. 2, 1999

[54] LOW OFFSET VOLTAGE ALINAS/GAINAS HETEROSTRUCTURE-CONFINEMENT BIPOLAR TRANSISTOR

[75] Inventors: Wen-Chau Liu, Tainan; Wen-Shiung Lour, Chilung; Jung-Hui Tsai, Tainan, all of Taiwan

[73] Assignee: National Science Council, Taipei, Taiwan

[21] Appl. No.: 08/931,087

[22] Filed: Sep. 15, 1997

[30] Foreign Application Priority Data

Jun. 7, 1997 [TW] Taiwan ................................. 86107873

[51] Int. Cl.⁶ .................................................. H01L 29/737
[52] U.S. Cl. ............................................ 257/198; 257/197
[58] Field of Search ........................................ 257/197, 198

[56] References Cited

U.S. PATENT DOCUMENTS

| | | | |
|---|---|---|---|
| 5,329,145 | 7/1994 | Nakagawa | 257/198 |
| 5,404,028 | 4/1995 | Metzger et al. | 257/15 |
| 5,598,015 | 1/1997 | Tanoue et al. | 257/197 |
| 5,604,356 | 2/1997 | Shiraishi | 257/17 |

*Primary Examiner*—John Guay
*Attorney, Agent, or Firm*—Randall J. Knuth

[57] ABSTRACT

The present provides two low offset voltage AlInAs/GaInAs heterostructure-confinement bipolar transistors which include AlInAs heterostructure-confinement and AlInAs/GaInAs superlattice-confinement bipolar transistors. In the present invention, an n GaInAs emitter layer is inserted at AlGaAs confinement layer/GaInAs base layer to reduce offset voltage and potential spike at an E-B junction.

2 Claims, 4 Drawing Sheets

LOW OFFSET VOLTAGE ALINAS/GAINAS HETEROSTRUCTURE-CONFINEMENT BIPOLAR TRANSISTOR

BACKGROUND OF THE INVENTION

1. Field of the Invention

The present invention relates to an AlInAs/GaInAs heterostructure confinement bipolar transistor, and especially relates to an AlInAs/GaInAs heterostructure confinement bipolar transistor which inserts an n GaInAs emitter layer to remove emitter-base potential spike and to lower offset voltage.

2. Description of the Related Art

Recently, in microwave, high-speed and high-power applications, hetero-junction bipolar transistors (HBT) have attracted much attention.

A substrate of InP material is suitable for integrated circuits. HBT with a base of GaInAs material is widely applied in many fields, for example, in a field for reducing transient time. A low surface-combination rate can effectively reduce base surface combination current and offset voltage, and increase current gain.

But, an AlInAs/GaInAs HBT has a large conduction band discontinuity ($\delta Ec$), e.g., 0.55 eV, at AlInAs/GaInAs junction. If a potential spike exists at a base-emitter junction, the emitter injection efficiency is eliminated to reduce output current and current gain in small current region. This characteristic is not suitable for high-current applications. In addition, if an offset voltage has occurred at an emitter-collector junction, the power consumption is increased, and the circuit applications are eliminated.

In the prior art, there are two methods to reduce offset voltage. The first is to use a graded composition at an E-B junction. The second is to insert n GaAs at an E-B junction. That is, a hetero-structure emitter bipolar transistor (HEBT) is performed. But these methods still have their disadvantages and difficulties. As to the first prior art, a precise composition is hard to achieve, and a graded compositioned at an E-B junction is not suitable for GaInAs/GaAs or AlInAs/GaInAs material. As to the second prior art, inserting n GaAs material at an E-B junction leads to a charge storage and reduces current gain.

SUMMARY OF THE INVENTION

Therefore, the present invention provides two low offset voltage transistors, AlInAs heterostructure-confinement bipolar transistor, and AlInAs/GaInAs superlattice-confinement bipolar transistor to overcome the disadvantages and difficulties of the prior art. In these two transistors, an n GaInAs emitter layer is inserted to eliminate a potential spike at an E-B junction and offset voltage.

In the present invention, the low offset voltage AlInAs heterostructure-confinement bipolar transistor comprises: a substrate; a buffer layer of GaInAs material, formed on the substrate; a collector layer of GaInAs material, formed on the buffer layer; a base layer of GaInAs material, formed on the collector layer; an emitter layer of GaInAs material, formed on the base layer; a confinement layer of AlInAs material, formed on the emitter layer; and an ohmic contact layer of GaInAs material, formed on the confinement layer.

In the present invention, the low offset voltage AlInAs/GaInAs superlattice-confinement bipolar transistor comprises: a substrate; a buffer layer of GaInAs material, formed on the substrate; a collector layer of GaInAs material, formed on the buffer layer; a base layer of GaInAs material, formed on the collector layer; an emitter layer of GaInAs material, formed on the base layer; a 15-period superlattice-confinement layer of AlInAs and GaInAs material, formed on the emitter layer; and an ohmic contact layer of GaInAs material, formed on the superlattice-confinement layer.

DESCRIPTION OF THE DRAWINGS

Other objects, features, and advantages of the present invention will become apparent from the following detailed description made with reference to an illustrative but non-restrictive embodiment. The description is made with reference to the accompanying drawings, in which.

DESCRIPTION OF THE PREFERRED EMBODIMENT

Figure 1:
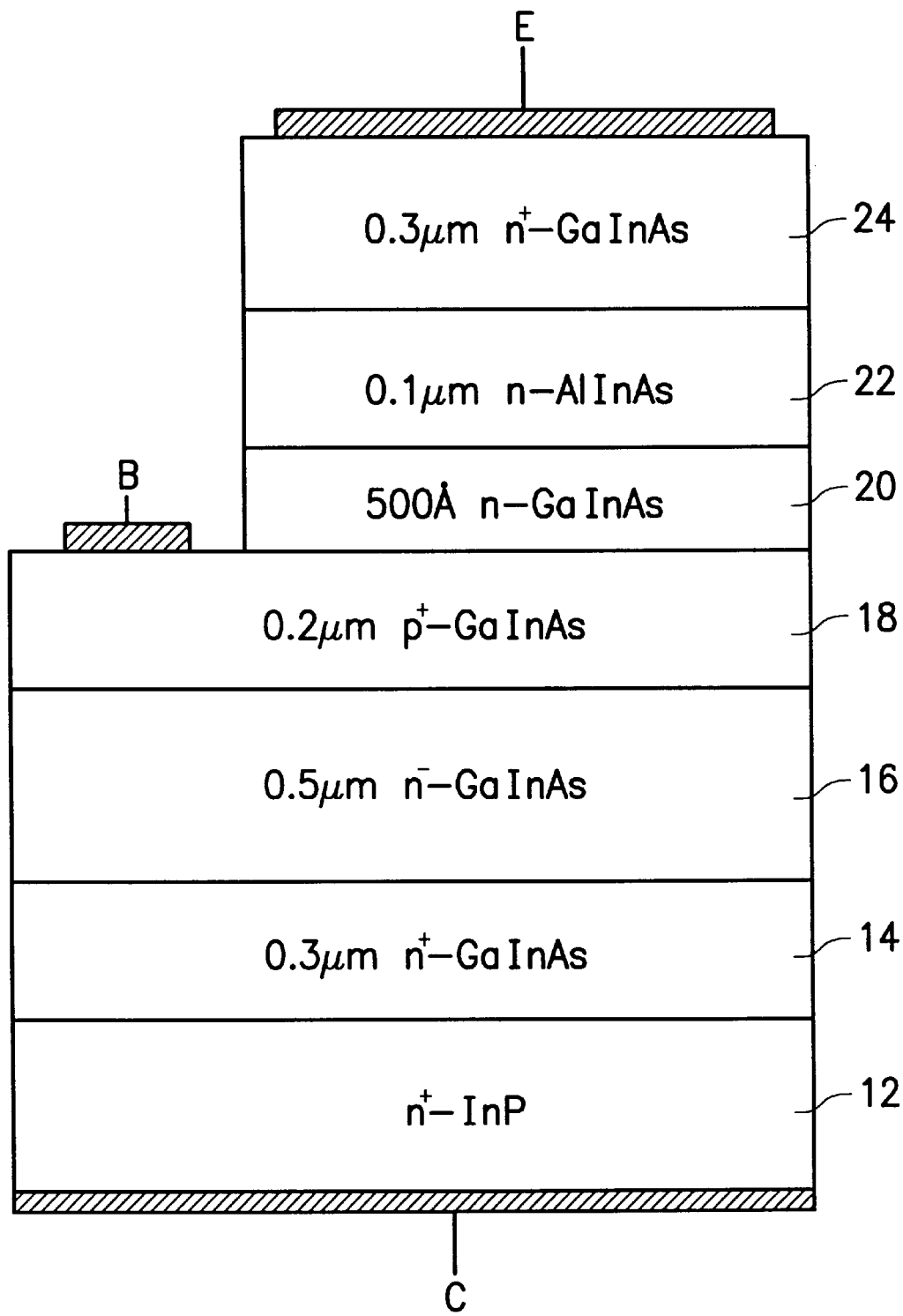
FIG. 1 is a diagram depicting the structure of a low offset voltage AlInAs heterostructure-confinement bipolar transistor of the present invention.

FIG. 1 is a diagram depicting the structure of a low offset voltage AlInAs heterostructure-confinement bipolar transistor of the present invention. Now refer to FIG. 1, the low offset voltage AlInAs heterostructure-confinement bipolar transistor comprises the following layers. A substrate 12 is of n$^+$ InP material. A buffer layer 14, formed on the substrate 12, is of n$^+$ GaInAs material and has a depth of 0.3 $\mu$m and a concentration of $5\times10^{18}$ cm$^{-3}$. A collector layer 16, formed on the buffer layer 14, is of n$^-$ GaInAs material and has a depth of 0.5 $\mu$m and a concentration of $5\times10^{16}$ cm$^{-3}$. A base layer 18, formed on the collector layer 16, is of p$^+$ GaInAs material and has a depth of 0.2 $\mu$m and a concentration of $5\times10^{16}$ cm$^{-3}$. An emitter layer 20, formed on the base layer 18, is of n GaInAs material and has a depth of 500 Å and a concentration of $5\times10^{17}$ cm$^{-3}$. A confinement layer 22, formed on the emitter layer 20, is of n AlInAs material and has a depth of 0.2 $\mu$m and a concentration of $5\times10^{17}$ cm$^{-3}$. An ohmic contact layer 24, formed on the confinement layer 22, is of n$^+$ GaInAs material and has a depth of 0.3 $\mu$m and a concentration of $5\times10^{18}$ cm$^{-3}$.

Figure 2:
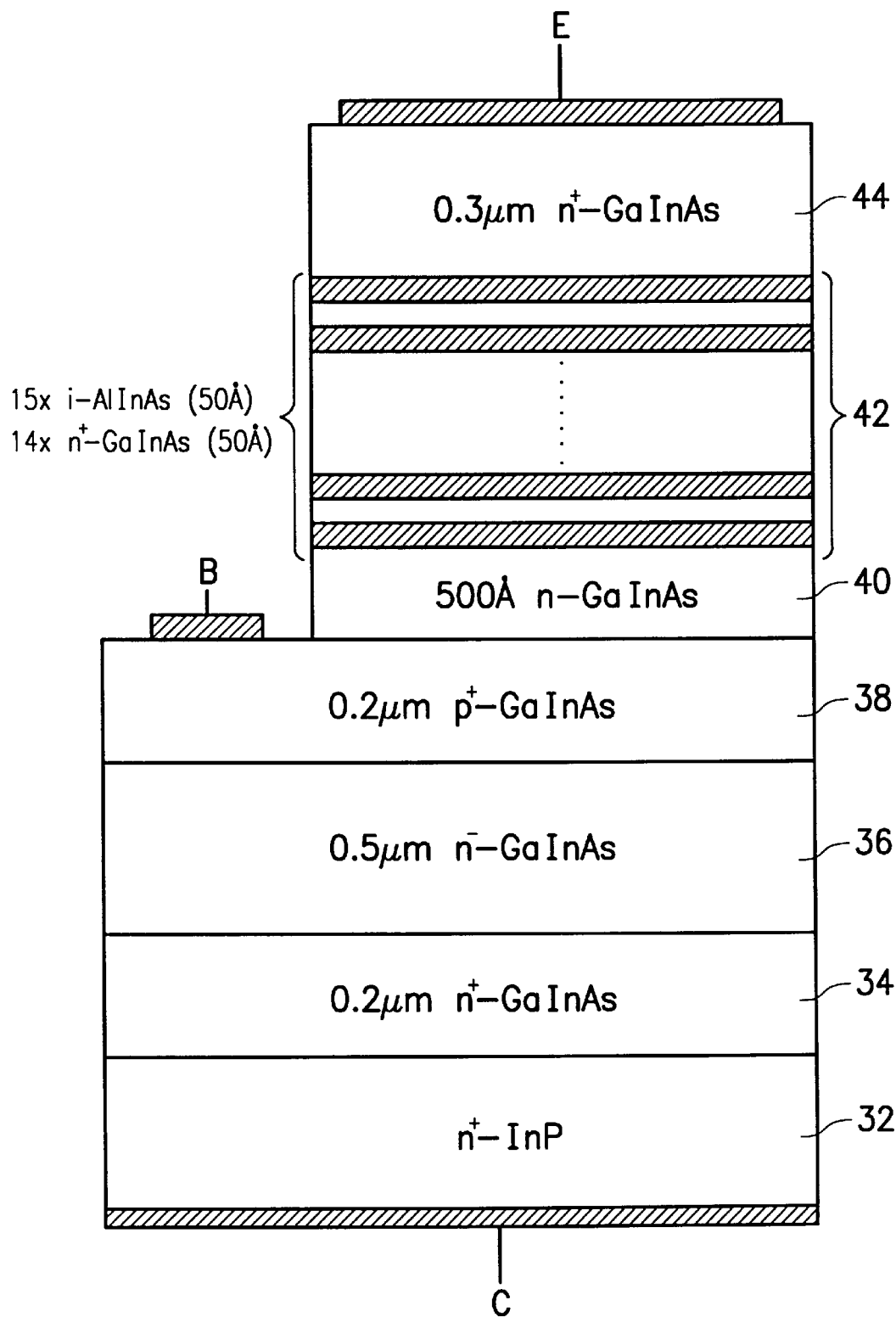
FIG. 2 is a diagram depicting the structure of a low offset voltage AlInAs/GaInAs superlattice-confinement bipolar transistor of the present invention.

FIG. 2 is a diagram depicting the structure of a low offset voltage AlInAs/GaInAs superlattice-confinement bipolar transistor of the present invention. Now refer to FIG. 2, in the present invention, the low offset voltage AlInAs/GaInAs superlattice-confinement bipolar transistor comprises the following layers. A substrate 32 is of n$^+$ InP material. A buffer layer 34, formed on the substrate 32, is of n$^+$ GaInAs material and has a depth of 0.2 $\mu$m and a concentration of $5\times10^{18}$ cm$^{-3}$. A collector layer 36, formed on the buffer layer 34, is of n$^-$ GaInAs material and has a depth of 0.5 $\mu$m and a concentration of $5\times10^{16}$ cm$^{-3}$. A base layer 38, formed on the collector layer 36, is of p$^+$ GaInAs material and has a depth of 0.2 μm and a concentration of $5\times10^{18}$ cm$^{-3}$. An emitter layer 40, formed on the base layer 38, is of n GaInAs material and has a depth of 500 Å and a concentration of $5\times10^{17}$ cm$^{-3}$. A 15-period superlattice-confinement layer 42, formed on the emitter layer 40, consists of the interlacing of fifteen barriers 421 with fourteen quantum wells 422. An ohmic contact layer 44, formed on the 15-period superlattice-confinement layer 42, is of n$^+$ GaInAs material and has a depth of 0.3 μm and a concentration of $5\times10^{18}$ cm$^{-3}$. Each barrier 421 is of nondoped AlInAs material and has a depth of 50 Å. Each quantum well 422 is of n$^+$ GaInAs, and has a depth of 50 Å and a concentration of $5\times10^{18}$ cm$^{-3}$.

Figure 3:
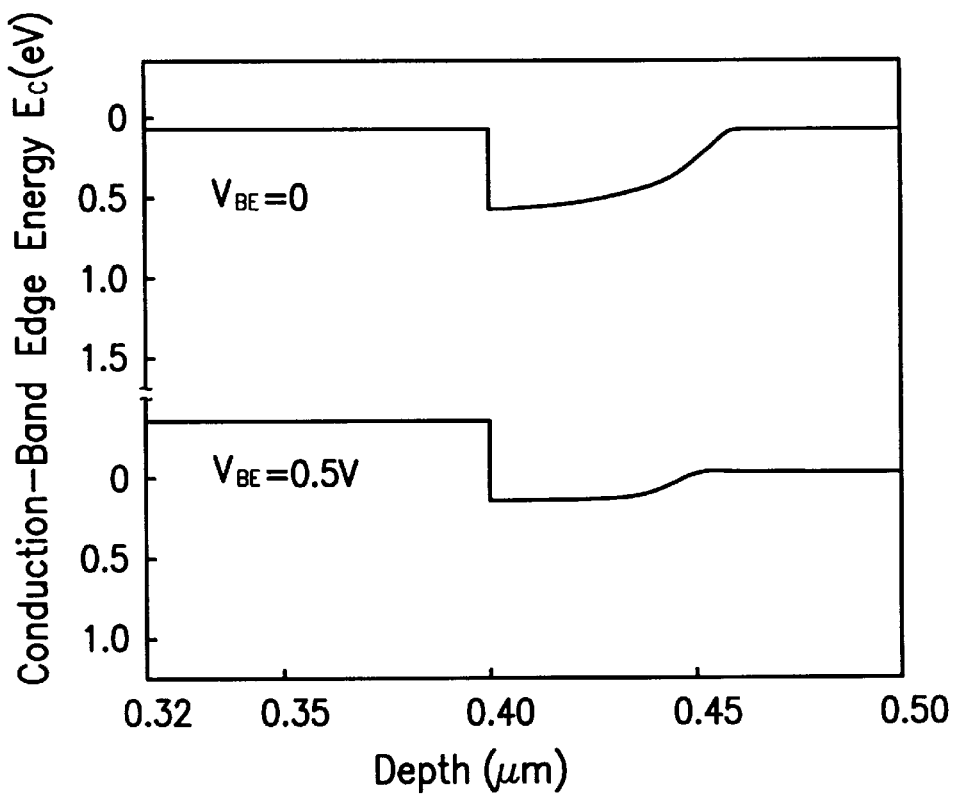
FIG. 3 is a diagram depicting an energy band of an E-B junction conduction band of the AlInAs heterostructure-confinement bipolar transistor of the present invention.

In order to understand how a potential spike is affected when an n GaInAs emitter layer is inserted in the case of AlInAs confinement bipolar transistor, the energy band diagram of the conduction band is shown in FIG. 3. By solving Poisson's equations, the following explanation is obtained.

When the forward bias at an E-B junction is small, no potential spike appears. Because the base layer is of GaInAs material, its surface combination rate is relatively low. Thus, the offset voltage is smaller, and the power consumption is lowered.

But when the forward bias at an E-B junction gets larger, a combination effect occurs at neutral emitter region due to a small hole diffusion-length in GaInAs material. Especially when the forward bias at an E-B junction is extremely large, the current gain becomes relatively small. That means, the larger the forward bias at E-B junction is, the smaller the current gain is.

Figure 4:
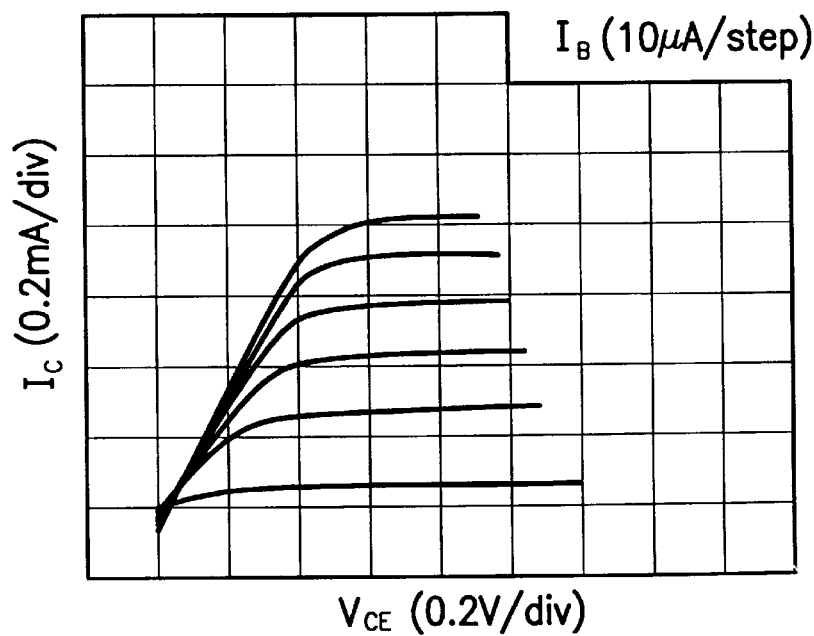
FIG. 4 depicts an output current-voltage characteristic of the AlInAs heterostructure-confinement bipolar transistor of the present invention.

FIG. 4 depicts an output current-voltage characteristic of the low offset voltage AlInAs heterostructure-confinement bipolar transistor of the present invention. In FIG. 4, the abscissa represents the collector-emitter voltage $V_{CE}$ with each scale of 0.2V; and the ordinate represents the collector current $I_C$ with each scale of 0.2 mA. The base current $I_B$ is 10 μA/step. From FIG. 4, it is known the offset voltage is only 40 mV, and the current gain is decreased from 25.

The present invention also provides an AlInAs/GaInAs superlattice-confinement bipolar transistor which utilizes a penetrating current to reduce the diffusion at thermal region. Thus, the current gain can be increased massively, and a small offset voltage is still maintained.

Figure 5:
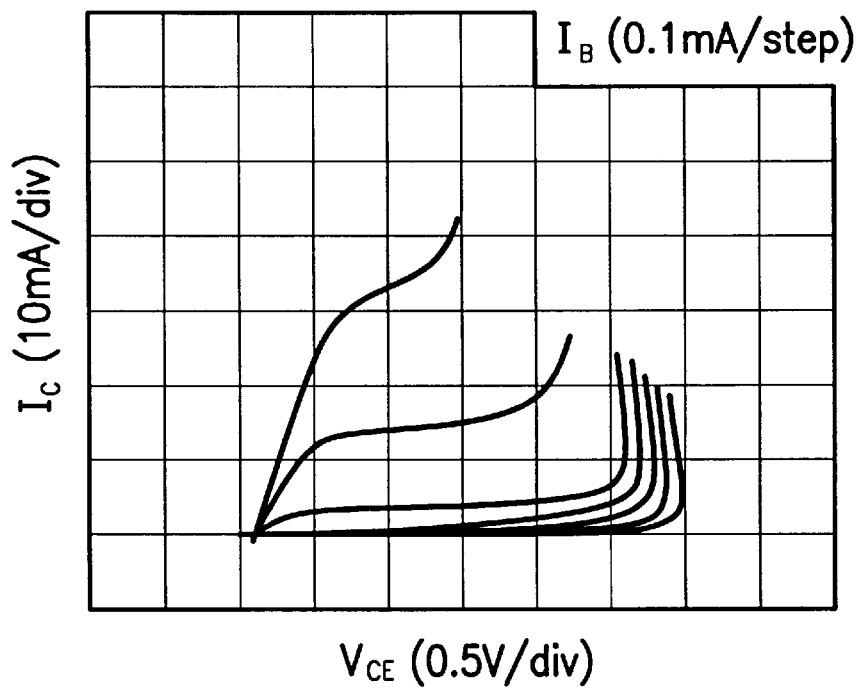
FIG. 5 depicts an output current-voltage characteristic of the AlInAs/GaInAs superlattice-confinement bipolar transistor of the present invention.

FIG. 5 depicts an output current-voltage characteristic of the low offset voltage AlInAs/GaInAs superlattice-confinement bipolar transistor of the present invention. In FIG. 5, the abscissa represents the collector-emitter voltage $V_{CE}$ with each scale of 0.5V; and the ordinate represents the collector current $I_C$ with each scale of 10 mA. The base current $I_B$ is 0.1 mA/step. From FIG. 5, it is known the current gain is over 240.

Figure 6:
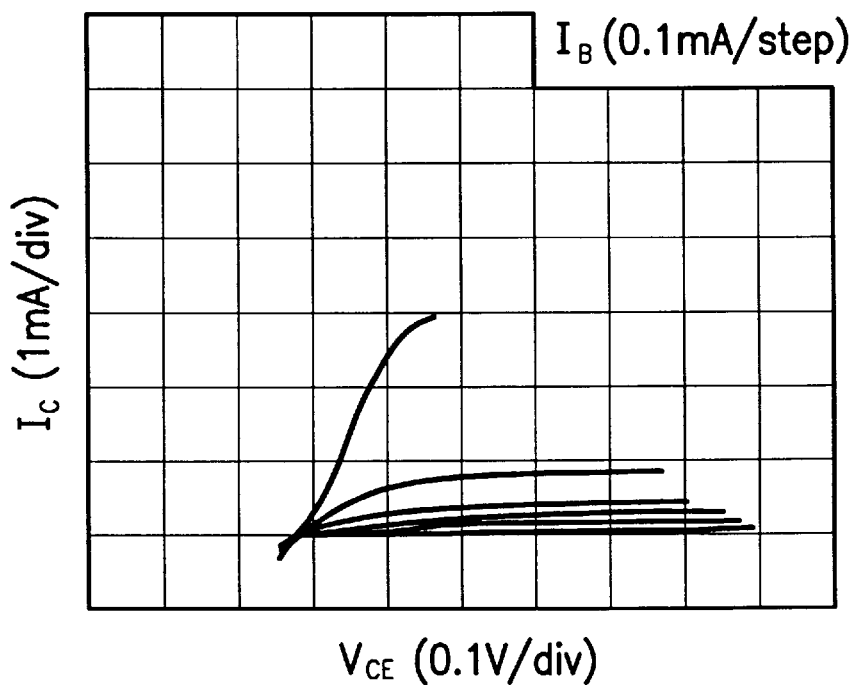
FIG. 6 depicts an output current-voltage characteristics in a small current region of the AlInAs/GaInAs superlattice-confinement bipolar transistor of the present invention.

FIG. 6 depicts an output current-voltage characteristic in a small current region of the low offset voltage AlInAs/GaInAs superlattice-confinement bipolar transistor of the present invention. In FIG. 6, the abscissa represents the collector-emitter voltage $V_{CE}$ with each scale of 0.1V; and the ordinate represents the collector current $I_C$ with each scale of 1 mA. The base current $I_B$ is 0.1 mA/step. From FIG. 6, it is known the offset voltage is only 80 mV.

In conclusion, in the present invention, the AlInAs heterostructure-confinement bipolar transistor is used to eliminate the offset voltage and the AlInAs/GaInAs superlattice-confinement bipolar transistor is used to increase the current gain.

The invention has been described in connection with preferred embodiments, modifications will now doubtlessly be apparent to those skilled in this technology. The foregoing description of the preferred embodiments of the invention has been provided for the purposes of illustration and description. It is not intended to be exhaustive or to limit the invention to the precise embodiment disclosed herein. The disclosed embodiment has been chosen and described to best explain the principles of the invention and its practical application, thereby enabling those who are skilled in this technology to understand the invention, to practice various other embodiments thereof and to make various modifications suited to the particular use contemplated of the present invention. As such, it is intended that the scope of this invention shall not be limited to the disclosed, but rather shall be defined by the following claims and their equivalents.

What is claimed is:

1. A low offset voltage AlInAs/GaInAs heterostructure-confinement bipolar transistor, comprising:

an n+ InP substrate;

a buffer layer of n+ GaInAs material with a thickness of approximately 0.3 μm and a concentration of approximately $5\times10^{18}$ cm$^{-3}$ deposited on said substrate;

a collector layer of n$^-$ GaInAs material with a thickness of approximately 0.5 μm and a concentration of approximately $5\times10^{16}$ cm$^{-3}$ deposited on said buffer layer;

a base layer of p+ GaInAs material with a thickness of approximately 0.2 μm and a concentration of approximately $5\times10^{18}$ cm$^{-3}$ deposited on said collector;

an emitter layer of n GaInAs material with a thickness of approximately 500 Å and a concentration of approximately $5\times10^{17}$ cm$^{-3}$ deposited on said base layer forming an emitter-base junction;

a confinement layer of n AlInAs material with a thickness of approximately 0.1 μm and a concentration of approximately $5\times10^{17}$ cm$^{-3}$ deposited over said emitter layer; and an ohmic contact layer of n+ GaInAs material with a thickness of approximately 0.3 μm and a concentration of approximately $5\times10^{17}$ cm$^{-3}$ deposited over said confinement layer, and wherein the transistor potential spike is eliminated at said emitter-base junction when n-GaInAs is used as the emitter of the transistor, and wherein the transistor, has a low surface recombination velocity when GaInAs material is used as said base layer, and wherein the transistor minority carries (holes) are confined when n-AlInAs material is used as confinement layer, and wherein the transistor offset voltage is extremely low when n-GaInAs and p$^+$-GaInAs are used as emitter and base layer of the transistor, respectively.

2. A low offset voltage AlInAs heterostructure-confinement bipolar transistor, comprising:

a substrate;

a buffer layer of GaInAs material, formed on said substrate;

a collector layer of n$^-$ GaInAs material with a thickness of 0.5 μm, and a concentration of $5\times10^{18}$ cm$^-$, formed on said buffer layer;

an emitter layer of GaInAs material, formed on said collector layer;

a confinement layer of AlInAs material, formed over said emitter layer; and an ohmic contact layer of GaInAs material, formed over said confinement layer.

* * * * *